United States Patent
Tekumalla

(10) Patent No.: US 8,850,280 B2
(45) Date of Patent: Sep. 30, 2014

(54) SCAN ENABLE TIMING CONTROL FOR TESTING OF SCAN CELLS

(75) Inventor: Ramesh C. Tekumalla, Breinigsville, PA (US)

(73) Assignee: LSI Corporation, San Jose, CA (US)

( * ) Notice: Subject to any disclaimer, the term of this patent is extended or adjusted under 35 U.S.C. 154(b) by 127 days.

(21) Appl. No.: 13/284,130

(22) Filed: Oct. 28, 2011

(65) Prior Publication Data
US 2013/0111286 A1    May 2, 2013

(51) Int. Cl.
*G01R 31/28* (2006.01)
*G01R 31/3185* (2006.01)

(52) U.S. Cl.
CPC .............. *G01R 31/318594* (2013.01)
USPC ........................................................ 714/731

(58) Field of Classification Search
CPC .............. G01R 31/318552; G01R 31/318594; G01R 31/31858; G01R 31/318541; H05K 999/99
See application file for complete search history.

(56) References Cited

U.S. PATENT DOCUMENTS

| | | | |
|---|---|---|---|
| 5,774,474 A | 6/1998 | Narayanan et al. | |
| 5,946,247 A * | 8/1999 | Osawa et al. | 365/201 |
| 6,442,722 B1 * | 8/2002 | Nadeau-Dostie et al. | 714/731 |
| 6,510,534 B1 * | 1/2003 | Nadeau-Dostie et al. | 714/724 |
| 7,831,876 B2 | 11/2010 | Goyal et al. | |
| 2002/0194558 A1 * | 12/2002 | Wang et al. | 714/718 |
| 2003/0084390 A1 * | 5/2003 | Tamarapalli et al. | 714/744 |
| 2004/0153926 A1 * | 8/2004 | Abdel-Hafez et al. | 714/726 |
| 2004/0268181 A1 * | 12/2004 | Wang et al. | 714/30 |
| 2005/0229056 A1 | 10/2005 | Rohrbaugh et al. | |
| 2006/0064616 A1 * | 3/2006 | Rajski et al. | 714/726 |
| 2008/0010572 A1 * | 1/2008 | Sul | 714/731 |
| 2008/0010573 A1 * | 1/2008 | Sul | 714/731 |
| 2008/0195346 A1 * | 8/2008 | Lin et al. | 702/119 |
| 2008/0222470 A1 * | 9/2008 | Satoi et al. | 714/726 |
| 2009/0235134 A1 | 9/2009 | Guo et al. | |
| 2010/0188096 A1 * | 7/2010 | Waayers et al. | 324/537 |
| 2011/0047426 A1 * | 2/2011 | Touba et al. | 714/729 |
| 2011/0166818 A1 * | 7/2011 | Lin et al. | 702/117 |
| 2011/0258501 A1 * | 10/2011 | Touba et al. | 714/726 |
| 2011/0264971 A1 * | 10/2011 | Bahl et al. | 714/731 |

OTHER PUBLICATIONS

W-S. Chuang et al., "Diagnosis of Multiple Scan Chain Timing Faults," IEEE Transactions on Computer-Aided Design of Integrated Circuits and Systems, Jun. 2008, pp. 1104-1116, vol. 27, No. 6.

(Continued)

*Primary Examiner* — Sam Rizk
*Assistant Examiner* — Enamul M Kabir

(57) ABSTRACT

An integrated circuit comprises scan test circuitry and additional circuitry subject to testing utilizing the scan test circuitry. The scan test circuitry comprises at least one scan chain having a plurality of scan cells. The scan test circuitry further comprises scan enable timing control circuitry coupled between a scan enable input of the scan test circuitry and scan enable inputs of respective ones of the scan cells. The scan enable timing control circuitry is operative to control timing of a transition between a scan shift configuration of the scan cells and a functional data capture configuration of the scan cells so as to permit testing of the scan cells in the scan shift configuration.

24 Claims, 6 Drawing Sheets

(56) References Cited

OTHER PUBLICATIONS

C-W. Tzeng et al., "Diagnosis by Image Recovery: Finding Mixed Multiple Timing Faults in a Scan Chain," IEEE Transactions on Circuits and Systems II: Express Briefs, Aug. 2007, pp. 690-694, vol. 54, No. 8.

Y-L. Kao et al., "Jump Simulation: A Fast and Precise Scan Chain Fault Diagnosis Technique," IEEE International Test Conference (ITC), Oct. 2006, 9 pages.

James Chien-Mo Li, "Diagnosis of Single Stuck-at Faults and Multiple Timing Faults in Scan Chains," IEEE Transactions on Very Large Scale Integration (VLSI) Systems, Jun. 2005, pp. 708-718, vol. 13, No. 6.

Y. Huang et al., "Statistical Diagnosis for Intermittent Scan Chain Hold-Time Fault," International Test Conference (ITC), Sep.-Oct. 2003, pp. 319-328.

* cited by examiner

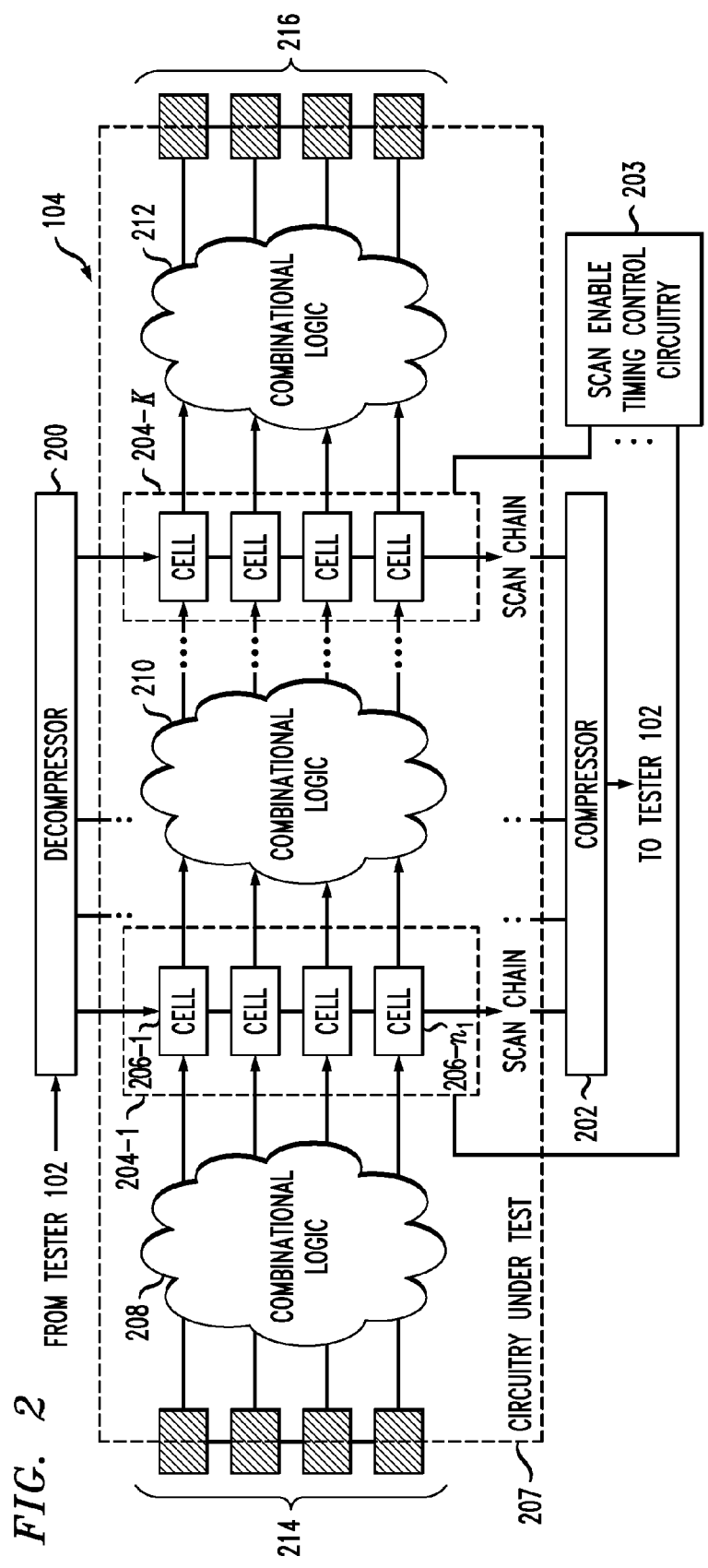

SCAN ENABLE TIMING CONTROL FOR TESTING OF SCAN CELLS

BACKGROUND

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. Additional details regarding compressed scan testing are disclosed in U.S. Pat. No. 7,831,876, entitled "Testing a Circuit with Compressed Scan Subsets," which is commonly assigned herewith and incorporated by reference herein.

Nonetheless, in both compressed and noncompressed scan testing, there remains a need for further improvements in scan testing performance.

SUMMARY

One or more illustrative embodiments of the invention provide a substantial improvement in scan testing by controlling the timing of a scan enable signal applied to scan cells of a scan chain so as to allow the scan cells themselves to be tested.

In one embodiment of the invention, an integrated circuit comprises scan test circuitry and additional circuitry subject to testing utilizing the scan test circuitry. The scan test circuitry comprises at least one scan chain having a plurality of scan cells. The scan test circuitry further comprises scan enable timing control circuitry coupled between a scan enable input of the scan test circuitry and scan enable inputs of respective ones of the scan cells. The scan enable timing control circuitry is operative to control timing of a transition between a scan shift configuration of the scan cells and a functional data capture configuration of the scan cells so as to permit testing of the scan cells in the scan shift configuration.

For example, the scan enable timing control circuitry may be configured to delay the transition between the scan shift configuration of the scan cells and the functional data capture configuration of the scan cells by at least two clock cycles relative to a transition in a scan enable signal applied to the scan enable input of the scan test circuitry.

The scan enable timing control circuitry in one or more of the illustrative embodiments may comprise a multi-stage pipeline for controlling the timing of the transition between the scan shift configuration of the scan cells and the functional data capture configuration of the scan cells. The multi-stage pipeline may comprise an input for receiving a scan enable signal applied to the scan enable input of the scan test circuitry and an output comprising a delayed version of the scan enable signal, and may be implemented using a plurality of flip-flops arranged in series with one another.

The scan test circuitry in one or more of the illustrative embodiments may further comprise a decompressor, a compressor, and a plurality of scan chains including the above-mentioned scan chain arranged in parallel with one another between respective outputs of the decompressor and respective inputs of the compressor. Scan test signals are applied to respective inputs of the decompressor. Scan test input data from the decompressor based on the scan test signals is shifted into the scan chains for use in the scan testing, and scan test output data indicative of results of the scan testing is subsequently shifted out of the scan chains into the compressor.

Scan test circuitry comprising scan enable timing control circuitry of the type described above can be configured to allow efficient at-speed testing of scan cells of a scan chain.

BRIEF DESCRIPTION OF THE DRAWINGS

FIG. 1 is a block diagram showing an integrated circuit testing system comprising a tester and an integrated circuit under test in an illustrative embodiment.

FIG. 2 illustrates one example of the manner in which scan chains of scan test circuitry may be arranged between combinational logic in the integrated circuit of FIG. 1.

DETAILED DESCRIPTION

Figure 3:
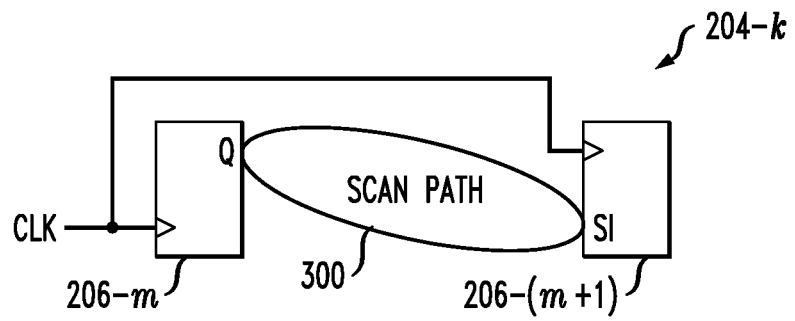
FIG. 3 shows a portion of a scan channel comprising a scan path between two adjacent scan cells in one of the scan chains of FIG. 2.

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by allowing scan enable signal timing to be controlled in a manner that allows testing of scan cells of a scan chain.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and embodiments of the invention are not limited in this regard. However, the illustrative embodiment shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, scan enable timing control circuitry 203 and a plurality of scan chains 204-$k$, where k=1, 2, ... K.

Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. The scan chains 204 may be associated with one or more distinct clock domains, or a single clock domain.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift the desired set of scan test patterns into all of the scan chains. It may therefore be assumed without limitation that all of the scan chains 204 are of length n, such that $n_1=n_2=\ldots=n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift mode of operation. The compressor 202 of the scan test circuitry 106 receives scan test output data shifted out of the scan chains 204, also when such chains are configured as respective serial shift registers in the scan shift mode of operation, and compresses that scan test output data for delivery back to the tester 102.

Compressed scan input data is applied by tester 102 to N scan inputs of decompressor 200, and compressed scan output data is provided from compressor 202 back to tester 102 via N scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number N of scan test outputs of the compressor 202. The ratio of K to N provides a measure of the degree of scan test pattern compression provided in the scan test circuitry 106. It should be noted, however, that the number of compressor outputs need not be the same as the number of decompressor inputs. For example, there may be N decompressor inputs and L compressor outputs, where N≠L but both N and L are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in the above-cited U.S. Pat. No. 7,831,876. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern.

Embodiments of the invention are configured to perform testing on the scan cells 206 of one or more of the scan chain 204. For example, such scan cell testing may be performed to ensure that the scan cells 206 are functioning properly and without timing faults in a scan shift mode of operation. This is particularly important for BIST embodiments and other embodiments in which scan shift is performed at or near the functional speed of operation of the integrated circuit.

The scan test circuitry 106 provides scan cell testing functionality by controlling the timing of a scan enable signal applied to scan cells of at least one of the scan chains 204 in a manner that allows the scan cells 206 of that scan chain to be tested. This scan cell testing functionality is provided at least in part by scan enable timing control circuitry 203 that is incorporated into the scan test circuitry 106, as will be described in greater detail in conjunction with FIGS. 3, 4A, 4B, 4C, 5, 6A and 6B below. The scan enable timing control circuitry 203 may be configured to permit at-speed testing of the scan cells in their scan shift configuration, while also allowing the source of particular timing faults to be identified in an efficient manner.

FIG. 3 shows a portion of a scan channel comprising a scan path 300 between two adjacent scan cells 206-$m$ and 206-($m$+1) in one of the scan chains 204-$k$ of FIG. 2. The scan path 300 shown starts from an output (Q) of scan cell 206-$m$ and ends at a scan input (SI) of the next cell 206-($m$+1) in the scan chain 204-$k$. The scan path 300 from Q to SI may be a simple wire connection or may include circuitry such as inverters, buffers, multiplexers, logic gates, etc. In any case, whether the scan path 300 comprises a simple wire connection or complex circuitry, the scan shift mode is generally configured to ensure that there is just one physical path that is activated from Q to SI in the scan shift mode, such that a signal value at Q will propagate to SI in the scan shift mode.

The scan enable timing control circuitry 203 is configured to allow at-speed testing of each scan path between any adjacent pair of scan cells of the scan chain 204-$k$, where at-speed testing denotes testing at or near the functional speed of operation of the associated functional circuitry. Such testing can also be used, for example, to determine the maximum speed of operation of the scan cells in their scan shift configuration, and/or to identify particular scan paths that fail at certain speeds of operation.

Figure 4A:
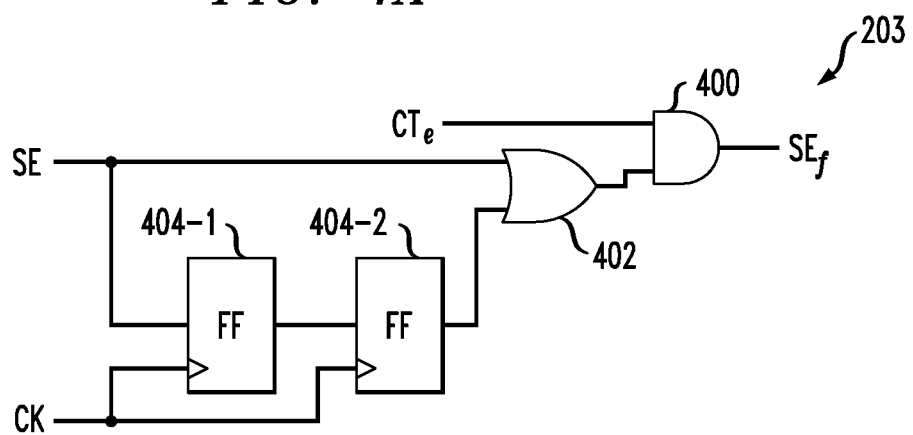
FIGS. 4A, 4B and 4C show different embodiments of a portion of the scan enable timing control circuitry of FIG. 2.

FIG. 4A shows the scan enable timing control circuitry 203 in one embodiment. The scan enable timing control circuitry 203 in this embodiment comprises a first logic gate 400 having a first input that receives a scan cell test control signal denoted $CT_e$, and a second logic gate 402 having an output coupled to a second input of the first logic gate 400 and a first input receiving a scan enable signal SE. The first and second logic gates 400 and 402 are illustratively shown as an AND gate and an OR gate, respectively, although other types and arrangements of logic gates can be used in other embodiments. The scan enable timing control circuitry 203 further comprises first and second flip-flops 404-1 and 404-2 connected in series with one another, with a data input of the first flip-flop 404-1 receiving the scan enable signal SE and a data output of the second flip-flop 404-2 being coupled to a second input of the second logic gate 402. The output of the first logic gate 400 provides a modified scan enable signal $SE_f$ that is applied to scan enable inputs of respective ones of the scan cells 206.

The scan enable signal SE provided to the data input of the flip-flop 404 and to an input of the logic gate 402 may be assumed by way of example to be a scan enable signal that is applied to a scan enable input of the scan test circuitry 106. This scan enable input may, but need not, correspond to a particular input pin of the integrated circuit 104.

The SE signal is driven to a first logic level, which for illustrative purposes in this embodiment of the invention will be assumed to be a logic "1" level, to place the integrated circuit 104 in the scan shift mode of operation, and is driven to a second logic level, which for illustrative purposes in this embodiment of the invention will be assumed to be a logic "0" level, to place the integrated circuit 104 in the functional mode of operation, although other types and combinations of operating modes and scan enable signaling may be used in other embodiments of the invention. For example, different portions of the integrated circuit 104 and its associated scan test circuitry 106 may be controlled using separate scan enable signals.

The flip-flops 404 collectively form a multi-stage pipeline for adjusting the timing of the scan enable signal SE. Both of these flip-flops are clocked by a common clock signal CK of an associated clock domain.

Figure 4B:
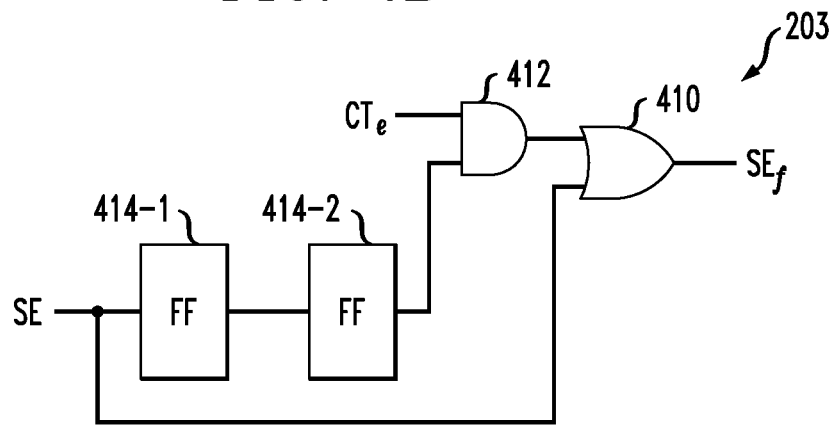
Figure 4C:
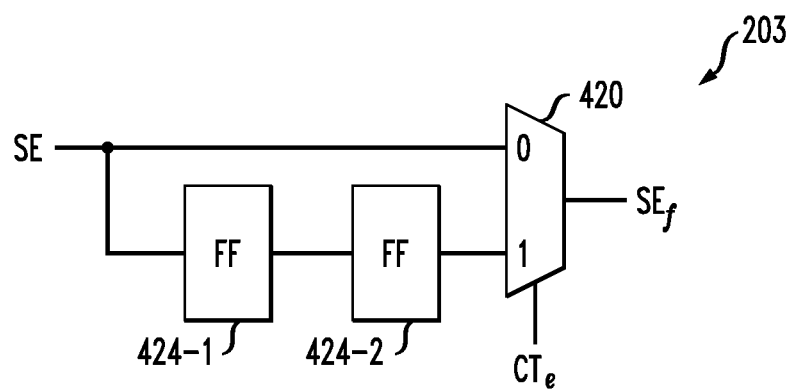
Figure 5:
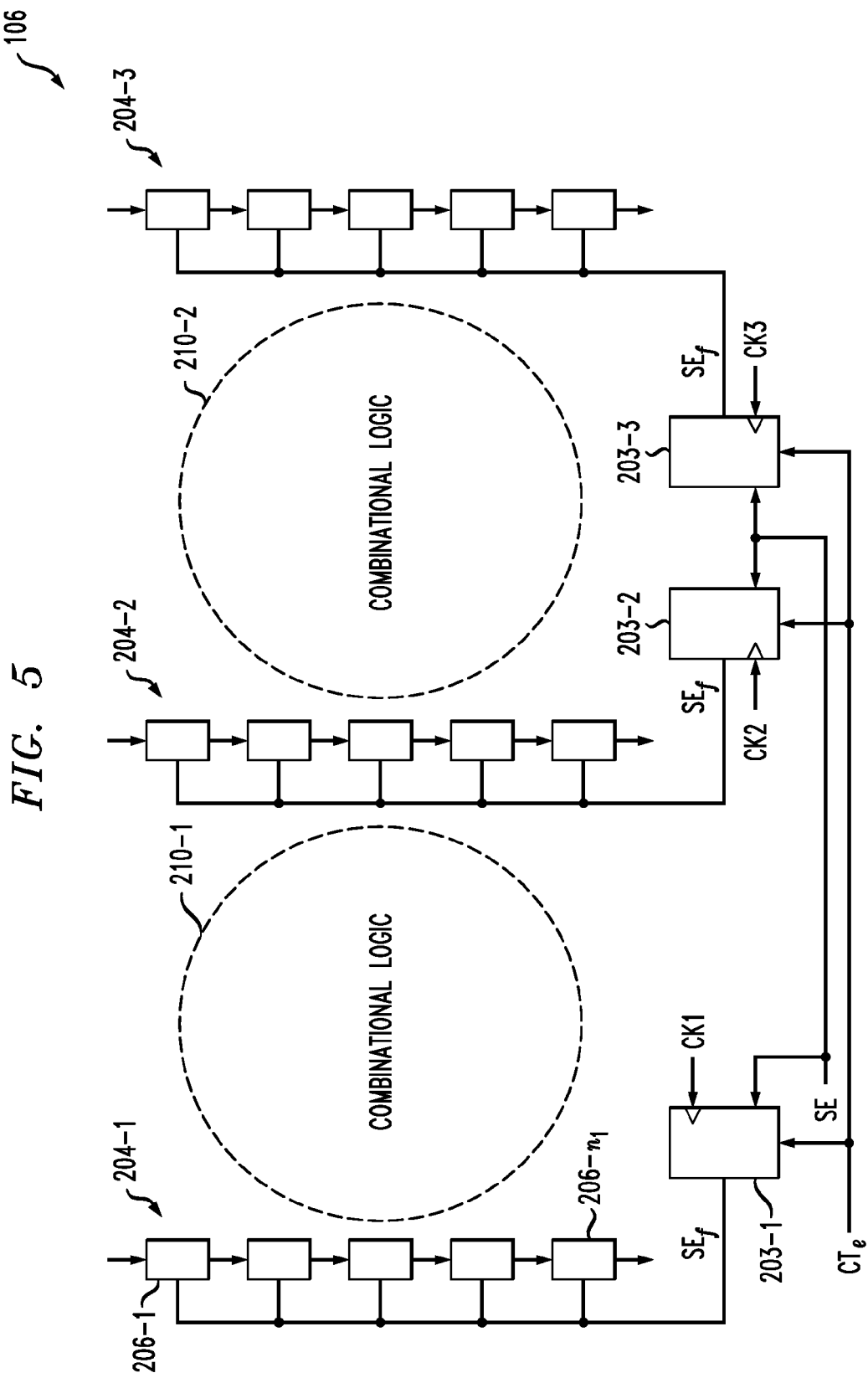
FIG. 5 shows another view of the scan enable timing control circuitry of FIG. 2 and its interconnection with multiple scan chains.

It is therefore assumed that the scan enable timing control circuitry 203 is associated with a single clock domain of the integrated circuit 104. Separate instances of the circuitry 203 as shown in FIG. 4A may be provided for each of a plurality of clock domains to be tested by the scan test circuitry 106, as is illustrated in FIG. 5. FIGS. 4B and 4C show other embodiments of the circuitry 203.

As will be described below, the scan enable timing control circuitry 203 in the present embodiment is configured to delay the transition between a scan shift configuration of the scan cells and a functional data capture configuration of the scan cells by two clock cycles relative to a transition in the scan enable signal SE applied to the scan enable input of the scan test circuitry. The multi-stage pipeline formed by flip-flops 404 controls the timing of the transition between the scan shift configuration of the scan cells and the functional data capture configuration of the scan cells, and its output may be viewed as comprising a delayed version of the scan enable signal SE. In other embodiments, the multi-stage pipeline may comprise more than two flip-flops, as well as other types and arrangements of logic circuitry.

In the FIG. 5 embodiment, there are three distinct scan chains shown, denoted as scan chains 204-1, 204-2 and 204-3, separated by combinational logic 210-1 and 210-2. The scan chains 204-1, 204-2 and 204-3 are associated with respective clock signals CK1, CK2 and CK3, each representing a different clock domain of the integrated circuit 104. The term "clock domain" as used herein is intended to be broadly construed, and accordingly should not be viewed as requiring or foreclosing any particular relationship among the clock signals CK1, CK2 and CK3. Moreover, the scan chains 204-1, 204-2 and 204-3 corresponding to the respective clock domains CK1, CK2 and CK3 have respective separate instances of the FIG. 4A circuitry 203, respectively denoted 203-1, 203-2 and 203-3. These repeated instances of the FIG. 4A circuitry may alternatively comprise repeated instances of the circuitry 203 as shown in FIG. 4B or FIG. 4C.

Each of the scan chains 204 comprises multiple scan cells 206 as previously described. A given one of these cells may comprise, for example, a functional data input, a functional data output, a scan input, a scan output, a scan enable input and a clock input, and may include additional or alternative inputs and outputs. For example, a given scan cell may include only a single data output that serves as a functional data output in functional mode and a scan output in scan shift mode. The multiple scan cells 206 of each of the scan chains 204-1, 204-2 and 204-3 are each clocked by the corresponding clock signal CK1, CK2 or CK3 associated with the clock domain of that scan chain.

As noted above, the scan cells 206 may be viewed as having a scan shift configuration and a functional data capture configuration. By way of example, in the scan shift configuration, the scan input of a given non-initial and non-final scan cell 206 of a scan chain 204 is connected to the scan output of a previous one of the scan cells of that scan chain and the scan output of the given scan cell is connected to the scan input of a next one of the scan cells of the scan chain, such that the given scan cell and the previous and next scan cells form at least a portion of a serial shift register. In the functional data capture configuration, the given scan cell and the other scan cells of the scan chain capture functional data applied to their respective functional data inputs.

The separate instances of the FIG. 4A circuitry 203-1, 203-2 and 203-3 corresponding to the respective scan chains 204-1, 204-2 and 204-3 in FIG. 5 are clocked by the respective clock signals CK1, CK2 and CK3. However, each circuitry instance 203-1, 203-2 and 203-3 also receives as inputs the same scan enable signal SE and scan cell test control signal $CT_e$. Each of the circuitry instances 203-1, 203-2 and 203-3 therefore operates in substantially the same manner, but utilizes a different one of the clock signals CK1, CK2 or CK3 in generating at its output a modified scan enable signal $SE_f$ for application to the scan enable inputs of the scan cells 206 of its corresponding scan chain 204-1, 204-2 or 204-3.

The operation of the FIG. 4A scan enable timing control circuitry 203, which as noted above is repeated in each of the sets of circuitry 203-1, 203-2 and 203-3 in FIG. 5, will now be described with reference to the timing diagram of FIG. 6A. The scan enable timing control circuitry 203 has three inputs, CTe, SE and CK, and one output $SE_f$. The particular CK input will depend upon the clock domain, and in FIG. 5 is given by CK1, CK2 and CK3 for the respective circuitry instances 203-1, 203-2 and 203-3. For purposes of describing the operation of a given instance of this circuitry as shown in FIG. 4A, the input clock signal will be referred to simply as CK, with it being understood that CK is actually CK1, CK2 and CK3 in the respective sets of circuitry 203-1, 203-2 and 203-3.

It should be noted that each clock domain may have an associated scan clock coming from a chip-level pin of the integrated circuit and functional clock coming from a functional clock divider of the integrated circuit 104. In such an arrangement, the CK signal shown in FIG. 4A may come from the chip-level pin in a scan shift phase and from the functional clock divider in the capture mode.

Figure 6A:
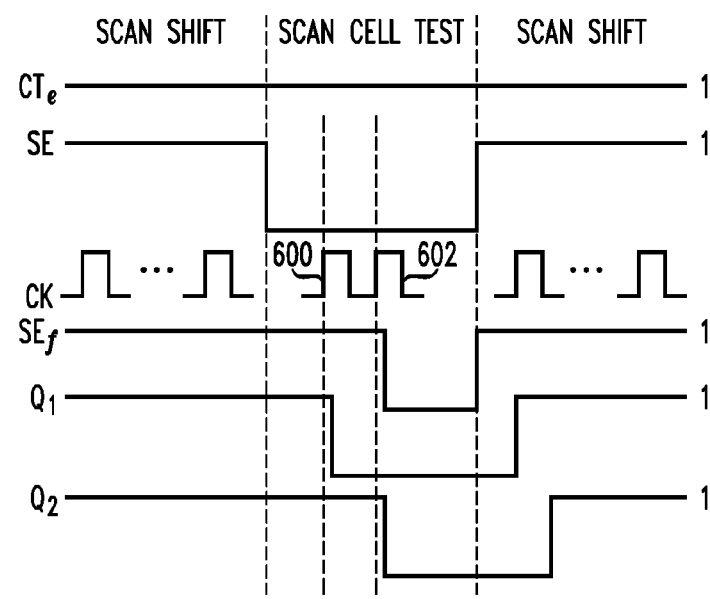
FIG. 6A is a timing diagram illustrating the operation of the scan enable timing control circuitry of FIG. 4A.

In the FIG. 6A timing diagram, $Q_1$ and $Q_2$ denote the respective data outputs of the flip-flops 404-1 and 404-2. Binary logic high and low values of "1" and "0" respectively are indicated simply as 1 and 0.

It can be seen from the FIG. 4A circuitry 203 that $SE_f=0$ when $CT_e=0$ or if SE=0 and CK is pulsed twice. Also, $SE_f=1$ when $CT_e=SE=1$. Furthermore, $SE_f=1$ when $CT_e=1$ and SE=0, if SE=1 for two pulses of CK before SE goes to 0. Accordingly, in the FIG. 4A embodiment, the condition $CT_e=1$ is required to make $SE_f=1$ but the condition $CT_e=0$ is not necessary to make $SE_f=0$.

Referring now to the timing diagram of FIG. 6A, during scan shift mode, CK comprises a continuous train of clock pulses, SE=1 and $CT_e=1$ and hence $SE_f=1$. Thus, the input of the first flip-flop 404-1 and the output of the second flip-flop 404-2 are both 1. At the end of scan shift, SE=0. If $CT_e$ remains at 1, $SE_f$ remains at 1, such that the scan enable inputs of the scan cells 206 remain at 1. An at-speed scan cell test can be performed for a given clock domain at this point by pulsing the corresponding clock signal CK twice as indicated by the clock pulses 600 and 602. During this scan cell test phase, before the first clock pulse 600, the input of the first flip-flop 404-1 is SE=0, the output $Q_1$ of the first flip-flop 404-1 is 1 and the output $Q_2$ of the second flip-flop 404-2 is 1. After the first clock pulse 600, the output of the first flip-flop becomes 0 and the output of the second flip-flop remains at 1 and so does $SE_f$. On the application of the second clock pulse 602, the output $Q_2$ of the second flip-flop 404-2 transitions from 1 to 0 and so does $SE_f$. However, the transition in $SE_f$ occurs only after the rising edge of the clock pulse 602 is applied to the scan cells, and therefore these scan cells capture the value at the scan input of the cell rather than the value at a functional data input of the cell, thereby permitting at-speed testing of the scan paths.

The scan cell test phase in the FIG. 6A timing diagram may be viewed as a type of capture phase, but because the modified scan enable signal $SE_f$ remains at 1 while capture clock pulses 600 and 602 are applied to the scan cells, these scan cells capture transitions on the scan paths rather than the functional data paths.

The scan cell test control signal $CT_e$ remains at 1 throughout the example scan shift and capture phases illustrated in FIG. 6A. However, this signal may be made to transition to 0 in conjunction with SE transitioning from 1 to 0, such that $SE_f$ also immediately transitions to 0, in order to permit the functional paths rather than the scan paths to be tested at-speed during the capture phase. Like the scan enable signal SE, the scan cell test control signal $CT_e$ may correspond to a particular input pin of the integrated circuit 104, such that dedicated input pins are used for both SE and $CT_e$. Thus, in one or more embodiments the scan cell test control signal $CT_e$ may be implemented as a chip-level signal having a logic state which determines whether functional logic or scan logic is subject to at-speed testing during a given capture phase between scan shift phases. In either case, the functional logic and the scan logic are tested in substantially the same manner.

As noted above, other embodiments of the scan enable timing control circuitry 203 are shown in FIGS. 4B and 4C. The corresponding timing diagram illustrating the operation of each of these embodiments is shown in FIG. 6B.

Referring now to FIG. 4B, the scan enable timing control circuitry 203 in this embodiment comprises a first logic gate 410 and a second logic gate 412, illustratively implemented as an OR gate and an AND gate, respectively. The scan cell test control signal $CT_e$ is applied to one of the inputs of the AND gate 412. The SE signal is applied to a data input of a multi-stage pipeline comprising first and second flip-flops 414-1 and 414-2 connected in series with one another, and is also applied to one of the inputs of the OR gate 410. The output of the AND gate 412 is coupled to another input of the OR gate 410. The output of the OR gate 410 provides the modified scan enable signal $SE_f$ that is applied to scan enable inputs of respective ones of the scan cells 206.

In the FIG. 4C embodiment, the scan enable timing control circuitry 203 comprises a two-to-one multiplexer 420. The scan cell test control signal $CT_e$ is applied to a select line of the multiplexer 420. The SE signal is applied to a data input of a multi-stage pipeline comprising first and second flip-flops 424-1 and 424-2 connected in series with one another, and is also applied to one of the inputs of the multiplexer 420. The output of the second flip-flop 424-2 is coupled to another input of the multiplexer 420. The output of the multiplexer 420 provides the modified scan enable signal $SE_f$ that is applied to scan enable inputs of respective ones of the scan cells 206.

Figure 6B:
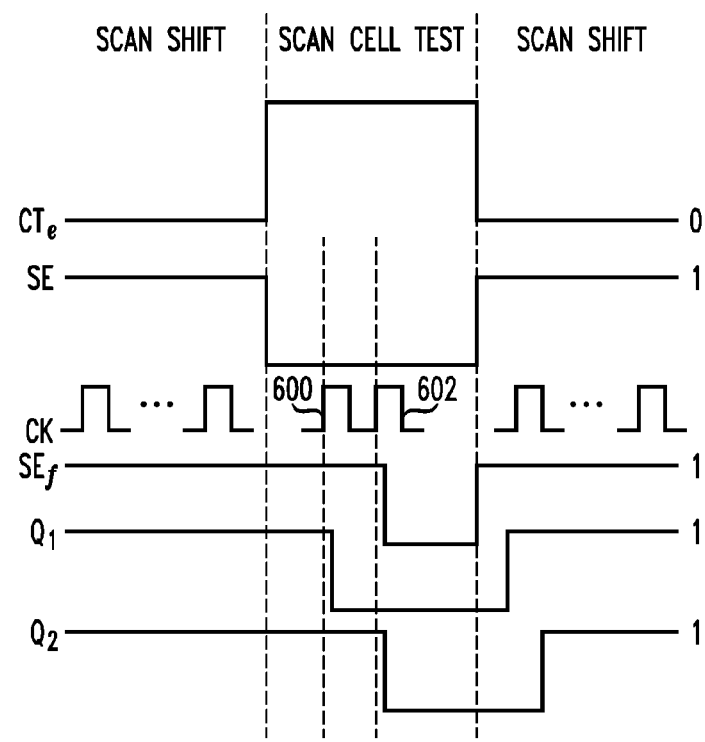
FIG. 6B is a timing diagram illustrating the operation of the scan enable timing control circuitry of FIGS. 4B and 4C.

With reference to the timing diagram of FIG. 6B, the operation of the circuitry 203 in the embodiments of FIGS. 4B and 4C is substantially the same as that of the embodiment of FIG. 4A, with the exception of the scan cell test control signal $CT_e$. More particularly, in the FIG. 4B and FIG. 4C embodiments, $CT_e$ is at a logic "0" level when the SE signal is at a logic "1" level, and vice-versa. Thus, in both of these embodiments, in order to enable at-speed testing of the scan paths, we set $CT_e$=1 and SE=0, while for scan shift, we set $CT_e$=0 and SE=1. The operation is otherwise the same as that previously described in conjunction with FIGS. 4A, 5 and 6A. As mentioned above, the repeated instances of the circuitry 203 denoted as 203-1, 203-2 and 203-3 in FIG. 5 may comprise repeated instances of the circuitry 203 as shown in FIG. 4B or FIG. 4C.

The scan enable timing control circuitry 203 as described in conjunction with the embodiments of FIGS. 4A, 4B, 4C and 5 ensures that all scan paths can be tested at-speed for both rising and falling transitions on those paths. The circuitry can also be used to determine a maximum operating frequency for the scan paths, by repeating the scan path testing at increasing or decreasing operating frequencies until timing faults are detected or eliminated, respectively. This allows for significant reductions in test time, by ensuring that the scan shift can be performed at or near its maximum operating frequency. Also, the circuitry allows the particular source of any timing fault to be identified, so that design changes can be made to remove the fault. Moreover, the circuitry is applicable for use in both compressed and non-compressed scan testing environments.

As mentioned previously, the scan enable timing control circuitry 203 is well-suited for use in BIST applications, since those applications often run the scan shift paths at higher operating frequencies than non-BIST applications. In a given BIST application, at least a subset of the scan chains 204 may be configured to include launch source flip-flops prior to the first scan cell of each chain in order to allow the scan paths leading to these first scan cells to be tested at-speed.

Particular scan cell test patterns may be loaded into the scan chains 204 in the scan shift phases of FIG. 6A or 6B. For example, two scan patterns may be used to completely test the scan chains for timing faults. These two patterns include a first test pattern comprising an alternating sequence of logic "1" and logic "0" values in which a logic "1" value is loaded into a first scan cell of the scan chain at the completion of an associated scan shift operation, and a second test pattern comprising an alternating sequence of logic "1" and logic "0" values in which a logic "0" value is loaded into a first scan cell of the scan chain at the completion of an associated scan shift operation. Other types and combinations of scan cell test patterns may be used in other embodiments.

In the above example with two test patterns with different alternating sequences, each pattern propagates alternating transitions on the scan paths and allows those transitions to be captured at the appropriate destination scan cells. For example, if there are three scan cells $F_{i-1}$, $F_i$ and $F_{i+1}$ adjacent to one another in a scan chain, the two test patterns are configured such that if a rising transition is launched on the scan path from $F_{i-1}$ to $F_i$, a falling transition is launched on the scan path from $F_i$ to $F_{i+1}$. If the switching activity exceeds the maximum power consumption supported by the design, the number of patterns can be increased and accordingly reduce the number of faults detected in each pattern.

It is to be appreciated that the particular circuits shown in FIGS. 4A, 4B, 4C and 5 are presented by way of illustrative example only, and numerous alternative arrangements of scan enable timing control circuitry may be used to provide an ability to test scan cells of a scan chain in the manner disclosed herein. This scan cell testing feature can be implemented in one or more of the illustrative embodiments without any significant negative impact on integrated circuit area requirements or functional timing requirements.

Figure 7:
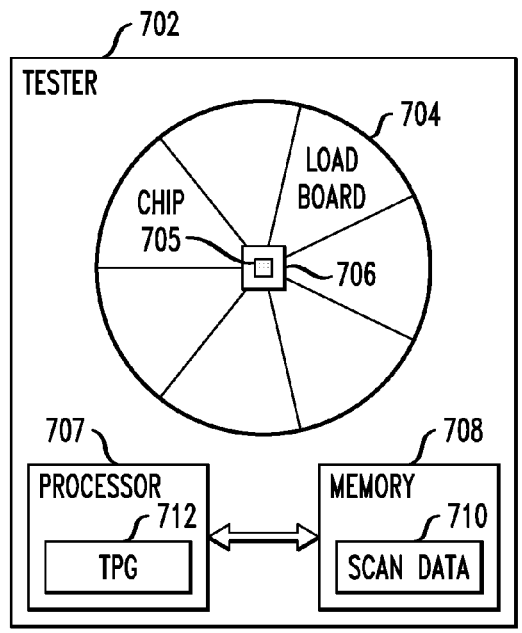
FIG. 7 shows one possible implementation of the testing system of FIG. 1.

The tester 102 in the testing system 100 of FIG. 1 need not take any particular form, and various conventional testing system arrangements can be modified in a straightforward manner to support the scan enable timing control functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored computer code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
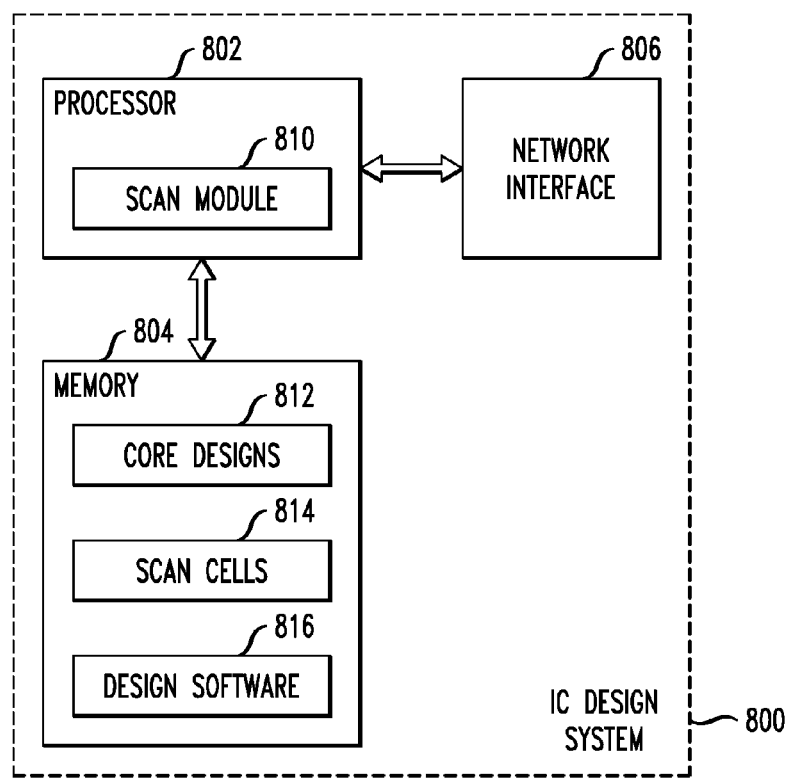
FIG. 8 is a block diagram of a processing system for generating an integrated circuit design comprising scan enable timing control circuitry of the type illustrated in FIGS. 4A, 4B and 4C.

The insertion of scan cells to form scan chains having associated scan enable timing control circuitry and other scan test circuitry of an integrated circuit design may be performed in a processing system 800 of the type shown in FIG. 8. Such a processing system in this embodiment more particularly comprises a design system configured for use in designing integrated circuits such as integrated circuit 104 to include scan test circuitry 106 having scan enable timing control circuitry 203.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated scan enable timing control circuitry in the manner disclosed herein, in conjunction with utilization of integrated circuit design software 816.

By way of example, the scan chain circuitry 106 comprising scan chains 204 and associated scan enable timing control circuitry 203 may be generated in system 800 using an RTL description and then synthesized to gate level using a specified technology library. A test generation model may then be created for generating test patterns using a test generation tool. Control files may be used to provide the test generation tool with information such as the timing control applied to one or more scan enable signals. Once the corresponding rules are in place, a rule checker may be run so that the test generation tool has visibility of the scan chains taking into account the operation of the scan enable timing control circuitry. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and scan enable timing control circuitry insertion functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of scan enable timing control circuitry, logic gates and other circuit elements, as well as different types and arrangements of multi-stage pipelines and scan enable and scan cell test control signaling, than those included in the embodiments described herein. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the scan test circuitry comprising at least one scan chain having a plurality of scan cells;
   the scan test circuitry further comprising scan enable timing control circuitry coupled between a scan enable input of the scan test circuitry and scan enable inputs of respective ones of the scan cells;
   wherein the scan enable timing control circuitry is operative to control timing of a transition between a scan shift configuration of the scan cells and a functional data capture configuration of the scan cells by generating a delayed version of a scan enable signal applied to the scan enable input of the scan test circuitry to delay a change in a logic level of the scan enable signal from a first logic level associated with the scan shift configuration to a second logic level associated with the functional data capture configuration until after both a first clock pulse and a rising edge of a second clock pulse ordinarily used for functional data capture in the functional data capture configuration are applied to the scan cells in the scan shift configuration so as to permit the first and second clock pulses to capture values at respective scan inputs of the scan cells during testing of the scan cells in the scan shift configuration.

2. The integrated circuit of claim 1 wherein in the scan shift configuration the scan cells of the scan chain form a serial shift register operative to receive an applied test pattern.

3. The integrated circuit of claim 1 wherein the scan enable timing control circuitry is configured to delay the transition between the scan shift configuration of the scan cells and the functional data capture configuration of the scan cells by at least two clock cycles relative to a transition in the scan enable signal applied to the scan enable input of the scan test circuitry.

4. The integrated circuit of claim 1 wherein the scan enable timing control circuitry comprises a multi-stage pipeline for controlling the timing of the transition between the scan shift configuration of the scan cells and the functional data capture configuration of the scan cells, the multi-stage pipeline comprising an input for receiving the scan enable signal applied to the scan enable input of the scan test circuitry and an output comprising the delayed version of the scan enable signal.

5. The integrated circuit of claim 4 wherein the multi-stage pipeline comprises a plurality of flip-flops arranged in series with one another.

6. The integrated circuit of claim 1 wherein a given one of the scan cells comprises:
   a functional data input;
   a scan input;
   a scan output;
   wherein in the scan shift configuration, the scan input of the scan cell is connected to a scan output of a previous one of the scan cells of the scan chain and the scan output of the scan cell is connected to a scan input of a next one of the scan cells of the scan chain, such that the given scan cell and the previous and next scan cells form at least a portion of a serial shift register; and
   wherein in the functional data capture configuration, the scan cell captures functional data applied to its functional data input.

7. The integrated circuit of claim 1 wherein the scan enable timing control circuitry comprises:
   a first logic gate having a first input adapted to receive a scan cell test control signal;
   a second logic gate having an output coupled to a second input of the first logic gate and a first input adapted to receive a scan enable signal applied to the scan enable input of the scan test circuitry; and
   a plurality of flip-flops connected in series with one another, with a data input of a first one of the flip-flops being adapted to receive the scan enable signal and a data output of a final one of the flip-flops being coupled to a second input of the second logic gate;
   wherein an output of the first logic gate is applied to the scan enable inputs of the respective ones of the scan cells.

8. The integrated circuit of claim 7 wherein the first logic gate comprises an AND gate and the second logic gate comprises an OR gate.

9. The integrated circuit of claim 7 wherein the plurality of flip-flops comprises only first and second flip-flops, with a data output of the first flip-flop being coupled to a data input of the second flip-flop, and wherein both of the flip-flops are clocked by a common clock signal of an associated clock domain.

10. The integrated circuit of claim 1 wherein the scan chain is associated with a particular clock domain of the integrated circuit and the scan test circuitry comprises one or more additional scan chains each associated with respective other clock domains of the integrated circuit.

11. The integrated circuit of claim 10 wherein the scan test circuitry comprises a separate set of scan enable timing control circuitry for each of said clock domains, with each of the sets of scan enable timing control circuitry comprising a multi-stage pipeline driven by the scan enable signal applied to the scan enable input of the scan test circuitry but clocked by a corresponding clock signal of its associated clock domain.

12. The integrated circuit of claim 2 wherein the scan test circuitry is configured to test the scan cells in the scan shift configuration by applying at least one scan cell test pattern to the serial shift register formed by the scan cells.

13. The integrated circuit of claim 12 wherein said at least one scan cell test pattern comprises at least one of a first test pattern comprising an alternating sequence of logic "1" and logic "0" values in which a logic "1" value is loaded into a first scan cell of the scan chain at the completion of an associated scan shift operation, and a second test pattern comprising an alternating sequence of logic "1" and logic "0" values in which a logic "0" value is loaded into a first scan cell of the scan chain at the completion of an associated scan shift operation.

14. The integrated circuit of claim 1 wherein the scan test circuitry further comprises:
 a decompressor;
 a compressor; and
 a plurality of scan chains including said at least one scan chain, with the scan chains being arranged in parallel with one another between respective outputs of the decompressor and respective inputs of the compressor;
 wherein scan test signals are applied to respective inputs of the decompressor;
 wherein scan test input data from the decompressor is shifted into the scan chains for use in the scan testing; and
 wherein scan test output data indicative of results of the scan testing is subsequently shifted out of the scan chains into the compressor.

15. A disk drive controller comprising the integrated circuit of claim 1.

16. A method comprising:
 configuring at least one scan chain to include a plurality of scan cells; and
 controlling timing of a transition between a scan shift configuration of the scan cells and a functional data capture configuration of the scan cells by generating a delayed version of a scan enable signal applied to a scan enable input of the scan test circuitry to delay a change in a logic level of the scan enable signal from a first logic level associated with the scan shift configuration to a second logic level associated with the functional data capture configuration until after both a first clock pulse and a rising edge of a second clock pulse ordinarily used for functional data capture in the functional data capture configuration are applied to the scan cells in the scan shift configuration so as to permit the first and second clock pulses to capture values at respective scan inputs of the scan cells during testing of the scan cells in the scan shift configuration.

17. The method of claim 16 wherein controlling timing of the transition comprises delaying the transition between the scan shift configuration of the scan cells and the functional data capture configuration of the scan cells by at least two clock cycles relative to a transition in the scan enable signal.

18. The method of claim 16 further comprising the step of testing the scan cells in the scan shift configuration by applying at least one scan cell test pattern to a serial shift register formed by the scan cells in the scan shift configuration.

19. The method of claim 18 wherein said at least one scan cell test pattern comprises at least one of a first test pattern comprising an alternating sequence of logic "1" and logic "0" values in which a logic "1" value is loaded into a first scan cell of the scan chain at the completion of an associated scan shift operation, and a second test pattern comprising an alternating sequence of logic "1" and logic "0" values in which a logic "0" value is loaded into a first scan cell of the scan chain at the completion of an associated scan shift operation.

20. A computer program product comprising a non-transitory computer-readable storage medium having computer program code embodied therein for use in scan testing an integrated circuit, wherein the computer program code when executed in a testing system causes the testing system to perform the steps of the method of claim 16.

21. A processing system comprising:
 a processor; and
 a memory coupled to the processor and configured to store information characterizing an integrated circuit design;
 wherein the processing system is configured to provide scan test circuitry within the integrated circuit design, the scan test circuitry comprising at least one scan chain having a plurality of scan cells;
 the scan test circuitry further comprising scan enable timing control circuitry coupled between a scan enable input of the scan test circuitry and scan enable inputs of respective ones of the scan cells;
 wherein the scan enable timing control circuitry is operative to control timing of a transition between a scan shift configuration of the scan cells and a functional data capture configuration of the scan cells by generating a delayed version of a scan enable signal applied to the scan enable input of the scan test circuitry to delay a change in a logic level of the scan enable signal from a first logic level associated with the scan shift configuration to a second logic level associated with the functional data capture configuration until after both a first clock pulse and a rising edge of a second clock pulse ordinarily used for functional data capture in the functional data capture configuration are applied to the scan cells in the scan shift configuration so as to permit the first and second clock pulses to capture values at respective scan inputs of the scan cells during testing of the scan cells in the scan shift configuration.

22. The integrated circuit of claim 1 wherein the scan enable timing control circuitry permits testing of the scan cells in the scan shift configuration by capturing the values at the respective scan inputs of the scan cells rather than values at respective functional data inputs of the scan cells.

23. The integrated circuit of claim 1 wherein the scan enable timing control circuitry permits at-speed testing between adjacent pairs of scan cells of the at least one scan chain.

24. The integrated circuit of claim 1 wherein the scan enable timing control circuitry permits testing of the scan cells in the scan shift configuration by capturing transitions in the scan paths of the at least one scan chain rather than functional data paths of the at least one scan chain.

* * * * *